US007473955B1

(12) United States Patent
Heshami et al.

(10) Patent No.: US 7,473,955 B1
(45) Date of Patent: Jan. 6, 2009

(54) FABRICATED CYLINDER CAPACITOR FOR A DIGITAL-TO-ANALOG CONVERTER

(75) Inventors: Mehrdad Heshami, Palo Alto, CA (US); Mansour Keramat, San Jose, CA (US)

(73) Assignee: Alvand Technologies, Inc., Santa Clara, CA (US)

( * ) Notice: Subject to any disclaimer, the term of this patent is extended or adjusted under 35 U.S.C. 154(b) by 137 days.

(21) Appl. No.: 11/371,148

(22) Filed: Mar. 7, 2006

(51) Int. Cl.
 *H01L 29/94* (2006.01)
(52) U.S. Cl. .................. 257/307; 257/296; 257/298; 257/306; 257/308; 341/150
(58) Field of Classification Search .............. 257/296, 257/298, 300, 303, 306, 307, 308; 341/150
See application file for complete search history.

(56) References Cited

U.S. PATENT DOCUMENTS 6,690,527 B1   2/2004  Nonaka
6,743,671 B2 *  6/2004  Hu et al. ............ 438/253
2006/0261394 A1 * 11/2006  Chien et al. ........ 257/303

* cited by examiner

*Primary Examiner*—Evan Pert
*Assistant Examiner*—Tan N Tran
(74) *Attorney, Agent, or Firm*—Stattler-Suh PC

(57) ABSTRACT

A fabricated cylinder capacitor having two or more layers is provided, each layer having a bottom plate and top plate portions. A first set of vias connect the bottom plate portions and a second set of vias connect the top plate portions. The bottom plate portions and the first set of vias comprise a bottom plate and the top plate portions and the second set of vias comprise a top plate of the capacitor. The layers may comprise five metal layers and may be produced using semiconductor fabrication methods. Also provided is a capacitor array having two or more cylinder capacitors where a set of connectors connect all top plates of the capacitors. The capacitor array may be used in a capacitive DAC, the capacitors being connected according to the architecture of the DAC. The capacitive DAC may be used in a SAR ADC.

14 Claims, 6 Drawing Sheets

FABRICATED CYLINDER CAPACITOR FOR A DIGITAL-TO-ANALOG CONVERTER

FIELD OF THE INVENTION

The invention is directed towards a fabricated cylinder capacitor for a digital-to-analog converter.

BACKGROUND OF THE INVENTION

A digital-to-analog converter (DAC) converts digital code into an analog signal and has a multitude of applications (e.g., in audio, video, signal processing, etc.). To perform this conversion, DACs may implement various components, such as switches, resistors, current sources, or capacitors. In particular, a capacitive DAC uses a bank of capacitors (comprising a plurality of capacitors having various capacitance values) and typically requires lower power as compared to other types of DACs. A capacitive DAC is a particularly useful component in mixed signal circuits.

However, for a capacitive DAC to achieve sufficient accuracy, large capacitors must typically be used in the capacitor bank. As known in the art, this is due to the use of capacitance value ratios in the conversion process that require good capacitor matching and ratio accuracy which is improved by larger capacitance values. However, the use of large capacitors results in increased chip area, lower processing speed, and reduced power benefit of the capacitive DAC. Also, use of large capacitors makes it difficult to achieve high ratio accuracy in the capacitor bank due to parasitic capacitances resulting from electric fields of capacitors dispersing to neighboring components.

As such, there is a need for a capacitor bank having small size, low-capacitance values with high precision and accuracy, good capacitor matching, and good shielding with low parasitic capacitances for use in a capacitive DAC.

SUMMARY OF THE INVENTION

Some embodiments of the invention provide a fabricated cylinder capacitor composed of two or more layers, each layer having a bottom plate portion and a top plate portion separated by a distance. A first set of vias connect the bottom plate portions of the layers and a different second set of vias connect the top plate portions of the layers. The bottom plate portions and the first set of vias comprise a bottom plate of the capacitor and the top plate portions and the second set of vias comprise a top plate of the capacitor. The layers may comprise five metal layers. In some embodiments, the capacitor is produced using semiconductor fabrication methods used for producing integrated circuits.

Some embodiments of the invention provide a capacitor array having two or more fabricated cylinder capacitors where a set of connectors connect all top plates of the capacitors. In some embodiments, the capacitor array is used in a capacitive DAC. The bottom plates of the capacitors in the array are connected according to the architecture of the DAC (e.g., binary weighted, segmented, etc.). In some embodiments, the capacitive DAC is used in a successive approximation analog-to-digital converter (SAR ADC).

The capacitor and capacitor array of some embodiments provide high accuracy at a small capacitor size and low capacitor values which allow creation of high-density, high-accuracy and high-speed DACs and SAR ADCs.

BRIEF DESCRIPTION OF THE DRAWINGS

The novel features of the invention are set forth in the appended claims. However, for purpose of explanation, several embodiments of the invention are set forth in the following figures.

DETAILED DESCRIPTION OF THE INVENTION

In the following description, numerous details are set forth for purpose of explanation. However, one of ordinary skill in the art will realize that the invention may be practiced without the use of these specific details. In other instances, well-known structures and devices are shown in block diagram form in order not to obscure the description of the invention with unnecessary detail.

I. Capacitive DAC

As known in the art, a capacitor is a device for storing an electric charge and is comprised of two plates (top and bottom plates) made of an electrically conducting material (such as metal) and separated by a nonconducting material or air. A voltage is applied to the plates and one plate becomes positively charged and the other negatively charged. As electric charge accumulates on the plates, an electric field is produced between the plates. If the applied voltage is removed, the plates of the capacitor remain charged and the presence of the electric field between the plates remains until it is discharged. The value of a capacitor's capacitance reflects the amount of charge stored on the plates and is expressed in farads. The capacitance is proportional to the surface area of the plates and inversely proportional to the distance between the plates. As such, capacitance can be increased by increasing the area of the plates.

Figure 1:
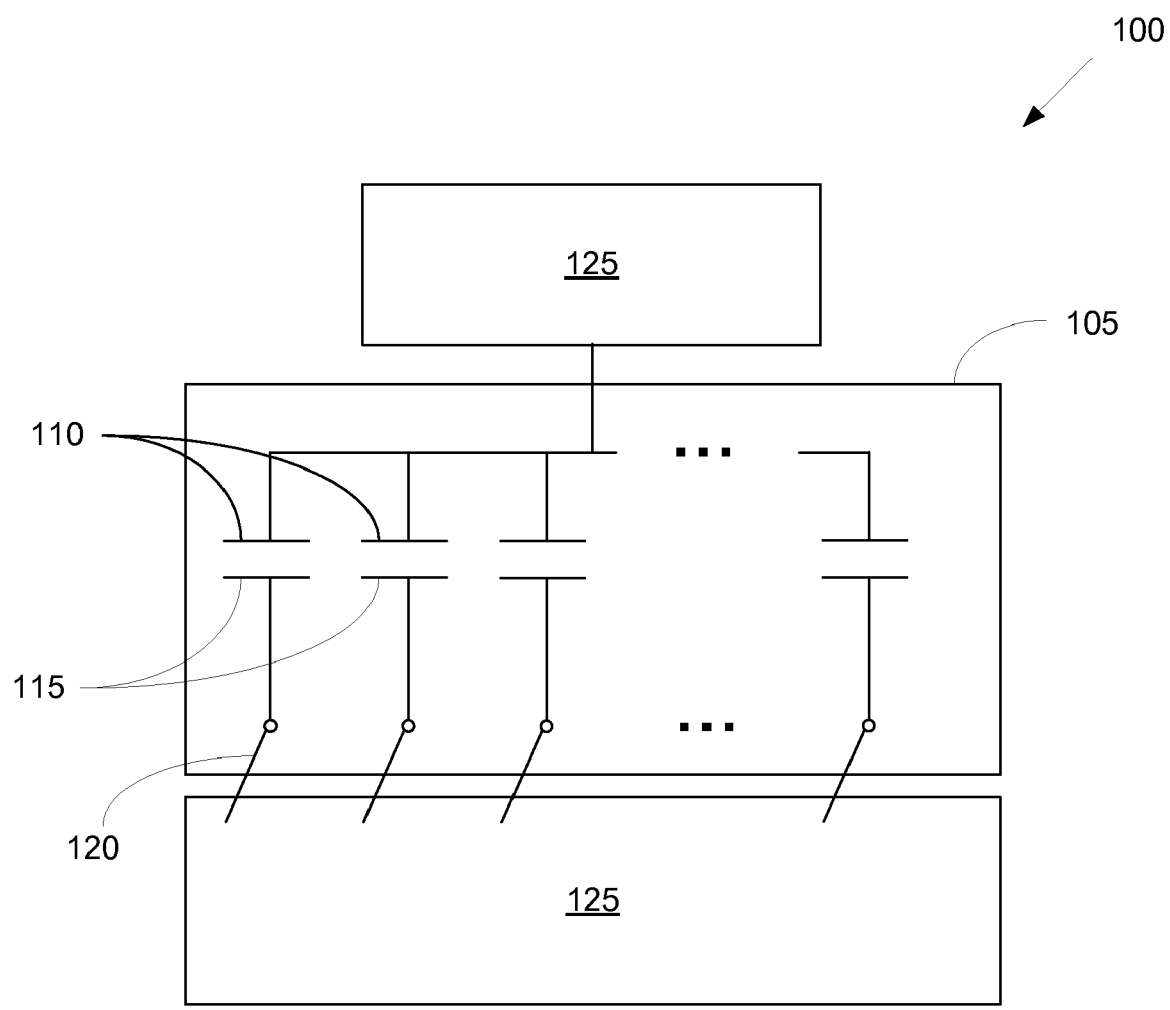
FIG. 1 is a block diagram of a generic capacitive DAC.

A capacitive DAC uses a bank of capacitors (comprising a plurality of capacitors having various capacitance values) and ratios of the capacitance values to convert a received digital code into an analog signal. FIG. 1 is a block diagram of a generic capacitive DAC 100 comprising a bank of capacitors 105 and various processing circuits 125. Each capacitor in the bank 105 has a F top plate 110 and a bottom plate 115. As shown in FIG. 1, all top plates 110 of the capacitors are coupled to each other and also coupled to one or more processing circuits 125 of the DAC. Each bottom plate 115 is typically connect to a switch 120 that couples and decouples the bottom plate of the capacitor to various processing circuits 125 of the DAC. The bottom plates 115 are coupled to the various processing circuits 125 according to the architecture of the DAC (e.g., binary weighted, segmented, etc.). The bank of capacitors 105 are used in conjunction with the various processing circuits 125 to convert the received digital code into the analog signal. The processing circuits 125 of the DAC are well known in the art and not discussed in detail here.

Examples of DAC architectures known in the art include pulse width modulator, oversampling (e.g., delta-sigma DAC), binary weighted, segmented, hybrid, etc. Regardless of the architecture type of a DAC, the resolution of a DAC is the number of possible output levels the DAC is configured to reproduce. DAC resolution is typically stated as the number of bits it uses (the bits going from a least significant bit (LSB) to a most significant bit (MSB)). In a binary weighted architecture, if a capacitor with capacitance A is used for the LSB, a capacitor with capacitance $2*A$ is used for the $2^{nd}$ LSB, a capacitor with capacitance $2*2*A$ is used for the $3^{rd}$ LSB, and so forth. In a segmented architecture, an equal capacitor segment is used for each possible value of the DAC output. For example, an 8-bit segmented DAC would have 256 segments and a 16 bit segmented DAC would have 65536 segments.

II. SAR ADC

Figure 2:
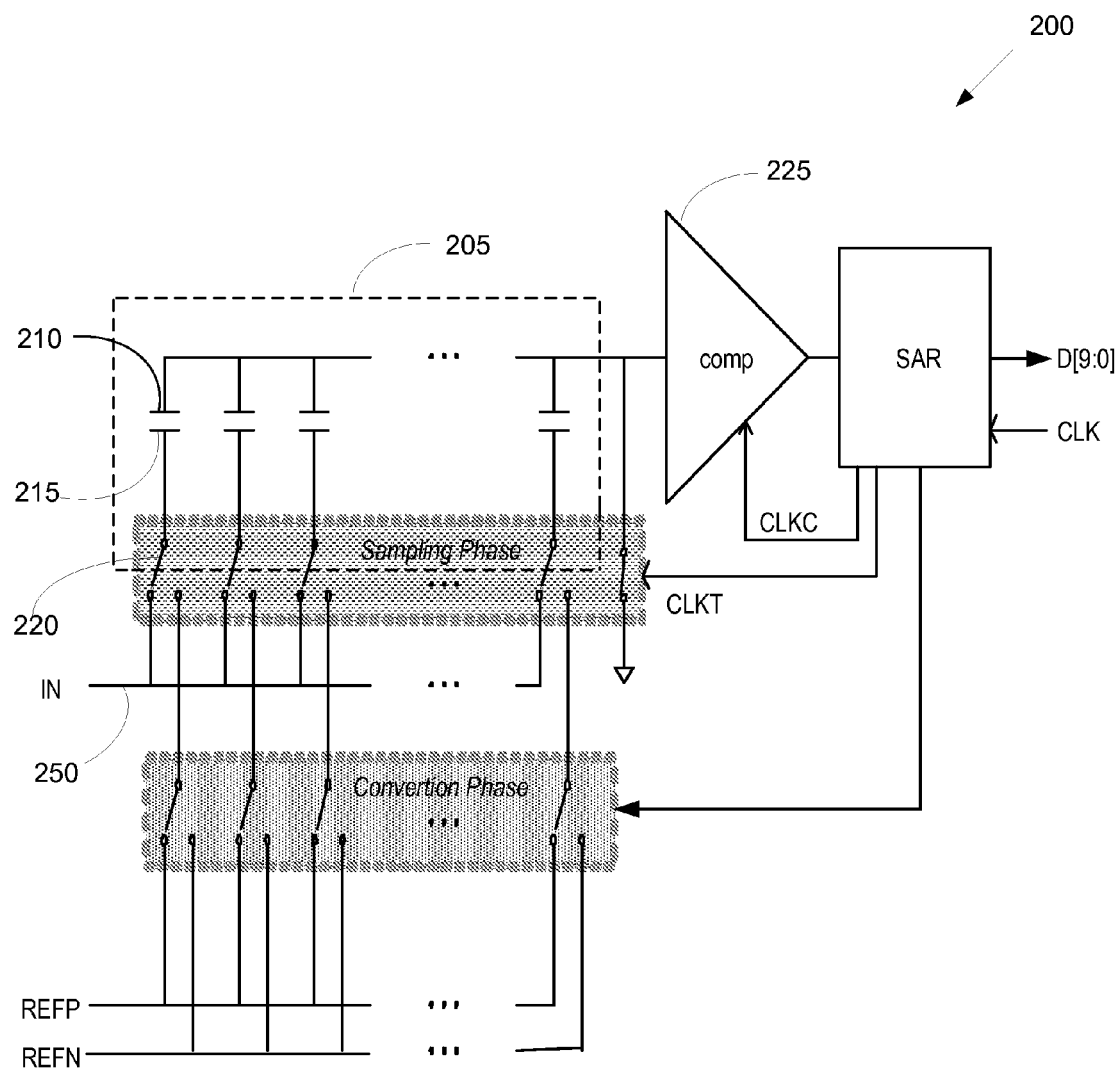
FIG. 2 is block diagram of a SAR ADC that uses a capacitive DAC.

A capacitive DAC is particularly useful in some analog-to-digital converters (ADCs), for example, a successive approximation analog-to-digital converter (SAR ADC). An ADC device converts a received analog signal into digital code output. FIG. 2 is block diagram of a SAR ADC 200 that uses a capacitive DAC. The SAR ADC 200 comprises a bank of capacitors 205 and various processing circuits. SAR ADCs are well known in the art and only a brief description of the components and operation of the SAR ADC is given here.

As shown in FIG. 2, all top plates 210 of the capacitors of the bank 205 are coupled to each other and also coupled to one or more processing circuits of the SAR ADC. Each bottom plate 215 is connected to a switch 220 that couples and decouples the bottom plate 215 of the capacitor to various processing circuits of the SAR ADC. The bottom plates 215 are coupled to the various processing circuits according to the architecture of the capacitive DAC (e.g., binary weighted, segmented, etc.) used in the SAR ADC.

During a sample phase, the SAR ADC 200 receives an analog signal (IN signal 250) and the switches 220 couple the bottom plates 215 of the capacitors to sample phase circuits of the SAR ADC to load the received signal across the capacitors in the bank 205. The SAR ADC 200 uses capacitance value ratios of the capacitors in the bank 205 and a comparator 225 to reject ranges of voltages of the received signal using successive approximation to set a final voltage range determination for the received signal. For example, in bit-weighting conversion (used in binary weighted architectures) the first comparison sets the MSB of the digital output, the second comparison sets the $2^{nd}$ MSB, the third comparison sets the $3^{rd}$ MSB, and so forth until the LSB of the digital output is set. During a conversion phase after the sample phase, the switches 220 are switched to couple the bottom plates 215 of the capacitors to the conversion phase circuits of the SAR ADC.

In a binary weighted architecture, the capacitor used for setting the MSB is shown as the farthest left capacitor in the bank 205, the capacitor used for setting the $2^{nd}$ MSB is shown as the $2^{nd}$ farthest left capacitor, and so forth, where the capacitor used for setting the LSB is shown as the farthest right capacitor in the bank. As discussed above, if a capacitor with capacitance A is used for the LSB, a capacitor with capacitance $2*A$ is used for the $2^{nd}$ LSB, a capacitor with capacitance $2*2*A$ is used for the $3^{rd}$ LSB, and so forth. As such, for a binary weighted DAC having 8 bit resolution, assuming that the capacitor used for setting the LSB has a capacitance value of 1 unit, the capacitance values of the capacitors in the bank 205 from left to right would be 128, 64, 32, 16, 8, 4, 2, and 1 units.

As discussed above, for a capacitive DAC to achieve sufficient accuracy, large capacitors must typically be used in the capacitor bank. However, the use of large capacitors results in increased chip area, lower processing speed, reduced power benefit, and parasitic capacitances.

III. Fabricated Cylinder Capacitor

Figure 3:
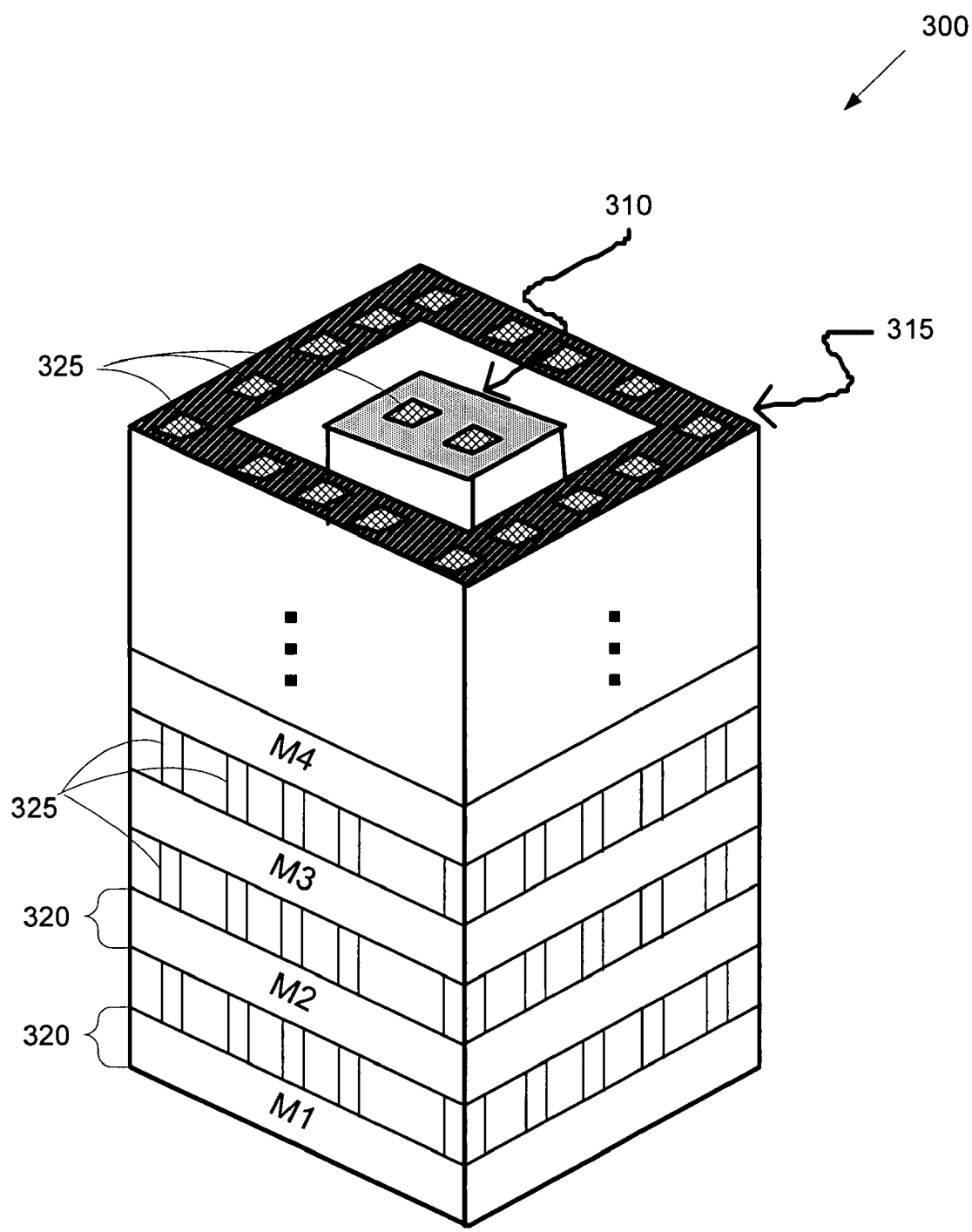
FIG. 3 shows a conceptual diagram of a fabricated cylinder capacitor formed from a plurality of layers.

A fabricated cylinder capacitor is provided herein to provide small size, low-capacitance values with high precision and accuracy, good capacitor matching, and good shielding with low parasitic capacitances that can be used, for example, in a capacitive DAC. FIG. 3 shows a conceptual diagram of a fabricated cylinder capacitor 300 comprising a top plate 310 and a bottom plate 315 formed from a plurality of layers 320 and vias 325. Each layer 320 comprises a portion of the top plate 310 and a portion of the bottom plate 315 of the cylinder capacitor 300, the top and bottom plate portions being separated by a distance. The bottom plate portions of the layers are connected by a first set of one or more vias 325, and the top plate portions of the layers are connected by a different second set of one or more vias 325.

The bottom plate portions and the first set of vias 325 comprise the bottom plate 315 of the capacitor 300 and the top plate portions and the second set of vias 325 comprise the top plate 310 of the capacitor 300; None of the bottom plate portions or first set of vias are coupled to any of the top plate portions or second set of vias so that the bottom and top plates are not coupled. As shown in FIG. 3, the top plate portion on each layer is enclosed by the bottom plate portion, where the bottom plate portion is a single unified structure across each layer. As such, the top plate 310 of the capacitor 300 is a column surrounded by the bottom plate 315 of the capacitor 300. This way, the top plate is shielded by the bottom plate, significantly reducing the parasitic capacitance of the top plate to nearby circuit nodes and hence improving accuracy. In some embodiments, the top and bottom plates are composed of rectangular shaped pieces. In other embodiments, the top and bottom plates are composed of other shaped pieces, such as cylinder shaped pieces, where the top plate is inside the cylindrically shaped bottom plate.

Figure 4:
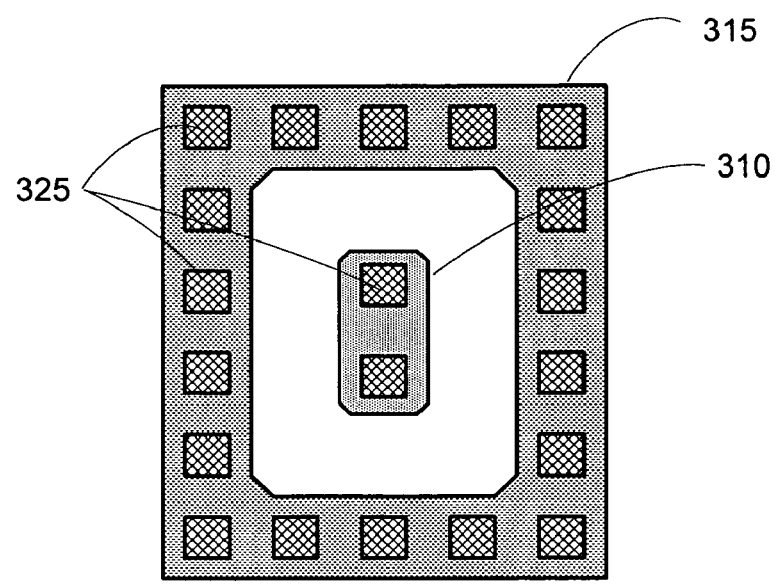
FIG. 4 shows a top view of the cylinder capacitor of FIG. 3.

FIG. 4 shows a top view of the cylinder capacitor 300 of FIG. 3. The top view shows a portion of the top plate 310 and a portion of the bottom plate 315 separated by a distance. The top plate portion of a layer is connected to top plate portions of other layer by vias 325 and the bottom plate portion of a layer is connected to bottom plate portions of other layer by vias 325. As shown in FIG. 4, the top plate portion 310 is enclosed by the bottom plate portion 315 which is a single unified structure across a layer.

In some embodiments, the cylinder capacitor 300 is comprised of two or more layers. In some embodiments, the cylinder capacitor 300 is comprised of five layers. As used herein, a "top layer" refers to the uppermost layer, a "bottom layer" refers to the lowest layer, an "upper layer" refers to the any layer that is not the bottom layer, and a "lower layer" refers to the any layer that is not the top layer of the cylinder capacitor.

Figure 5:
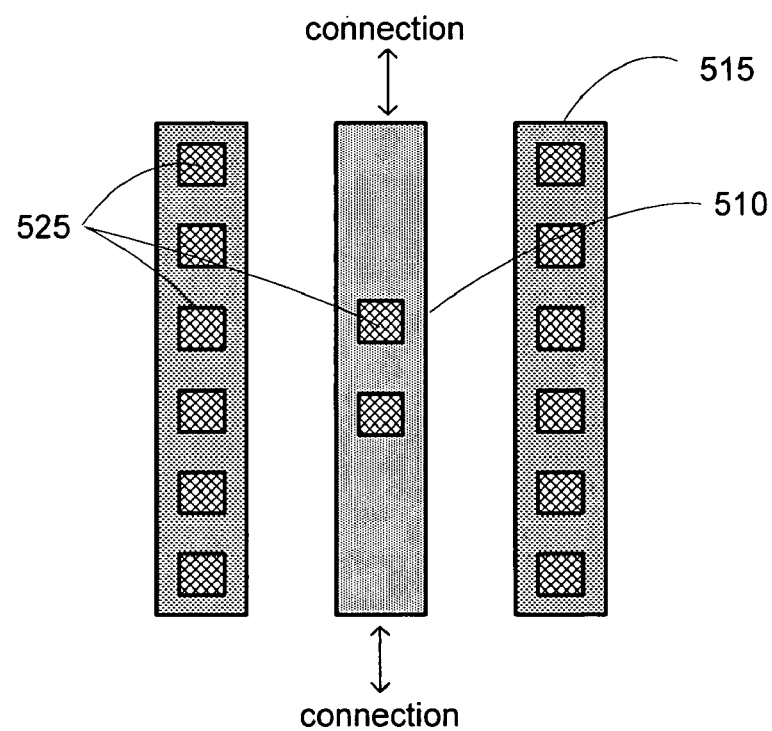
FIG. 5 shows a top view of a top layer of the cylinder capacitor of an alternative embodiment.

In an alternative embodiment, FIG. 4 shows a top view of the lower layers of the cylinder capacitor where the top layer has a different form than the lower layers. FIG. 5 shows a top view of a top layer of the cylinder capacitor of the alternative embodiment. As shown in FIG. 5, the top layer comprises a bottom plate portion 515 comprising two separate structures being unconnected across the top layer and a top plate portion 510 being between the two separate structures and separated from both structures by a distance. As shown in FIG. 5, the top plate portion 510 is not completely enclosed by the bottom plate portion 515 which allows easy coupling/connection to the top plate portion 510 from the side of the top layer to a connector from the outside.

Figure 6:
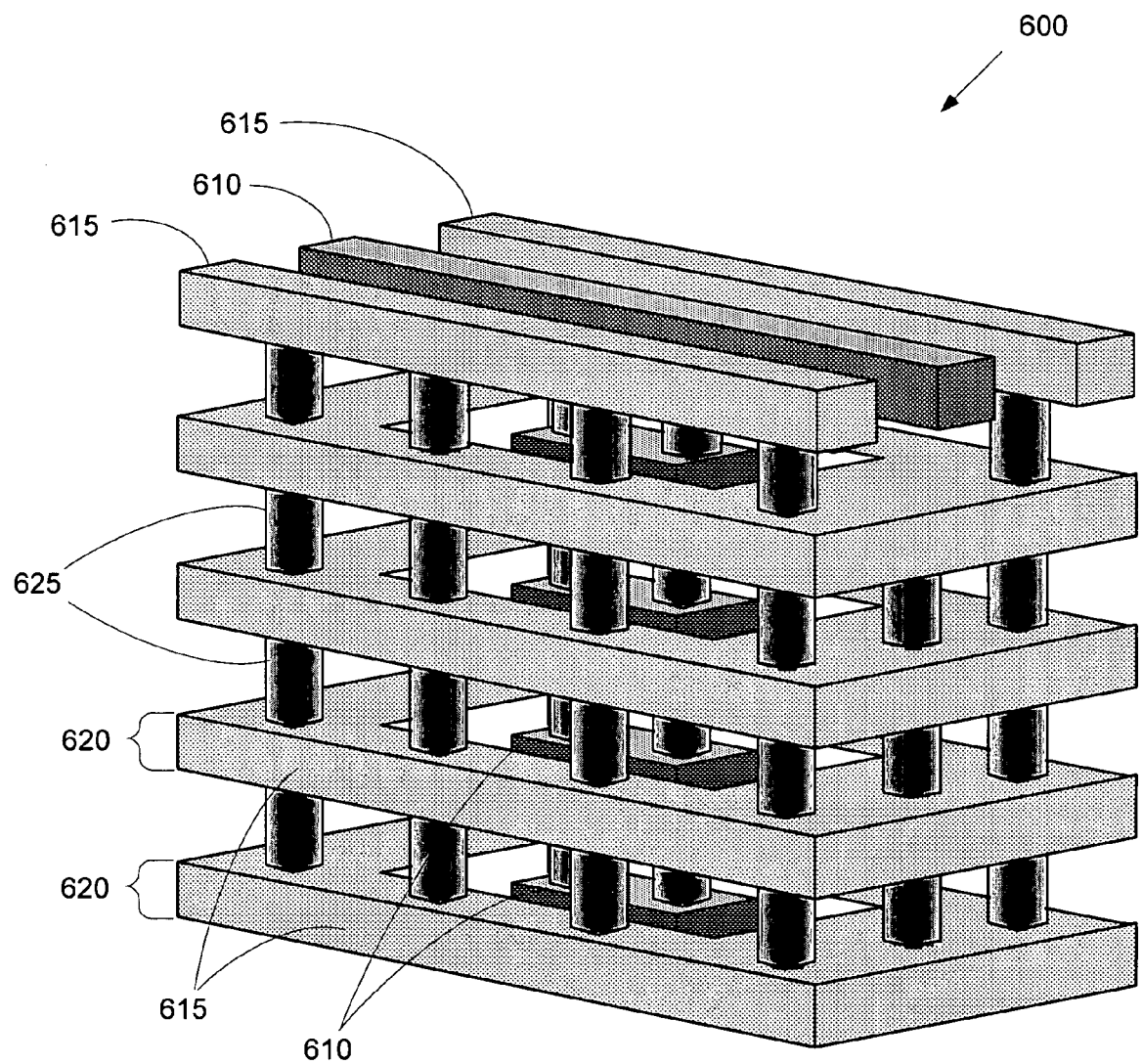
FIG. 6 shows a three dimensional diagram of a fabricated cylinder capacitor having as the top layer the layer shown in FIG. 5.

FIG. 6 shows a three dimensional diagram of a fabricated cylinder capacitor 600 having as the top layer the layer shown in FIG. 5. As shown in FIG. 6, the cylinder capacitor 600 is comprised of five layers 620, although in other embodiments, a different number of layers is used. The fifth top layer is the layer shown in FIG. 5 and the first to fourth lower layers are the layer shown in FIG. 4. Bottom plate portions 615 of each layer are connected by a first set of vias 625 and top plate portions 610 of each layer are connected by a different second set of vias 625.

In some embodiments, the layers of the cylinder capacitor are comprised of metal layers (e.g., M1, M2, M3, etc.), the metal layers being formed, for example, from any metal oxide or alloy, single element compounds or compositions of multiple metals, etc. In some embodiments, the cylinder capacitor is formed using semiconductor fabrication methods, for example, as conventionally used for producing integrated circuits. For example, the capacitor may be formed on a substrate of any material suitable for a capacitor (e.g., GaAs, silicon, germanium, etc.) where the bottom metal layer is formed on the substrate and upper layers are deposited one by one on top of the bottom metal layer. The capacitor may be formed by any deposition technique (e.g., chemical or physical vapor deposition, etc.). Methods of semiconductor fabrication are well known in the art and not discussed in detail here.

The cylinder capacitor can be used in a capacitor bank of a capacitive DAC where it is used and connected similar to a conventional capacitor in the bank. In some embodiments, the cylinder capacitor comprises a single unit capacitor having a particular capacitance value A that is used for the LSB of a capacitive DAC. The capacitance value of the cylinder capacitor can be found by determining the capacitance value of each layer and summing the capacitance values. For example, if each layer of a five-layer cylinder capacitor provides a capacitance of 0.2 fF, the cylinder capacitor has a total capacitance of approximately 1.0 fF.

IV. Capacitor Array

Figure 7:
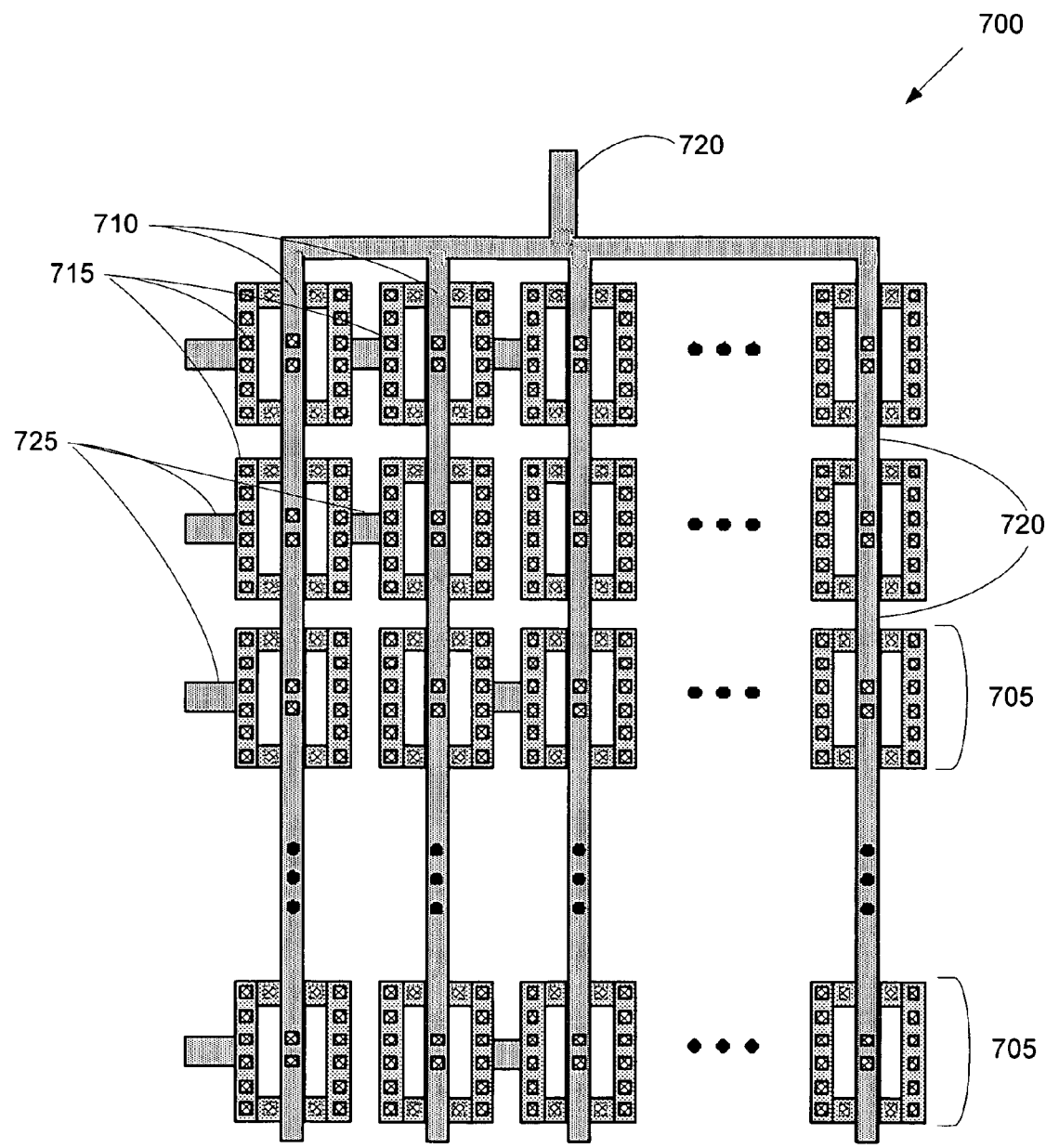
FIG. 7 shows a top view of a two dimensional capacitor array comprising two or more cylinder capacitors.

In some embodiments, a capacitor array is provided comprising two or more cylinder capacitors. In some embodiments, the two or more cylinder capacitors have approximately equal capacitance values. FIG. 7 shows a top view of a two dimensional capacitor array 700 comprising two or more cylinder capacitors 705 arranged in a predetermined number of columns and rows. In some embodiments, the number of columns is equal to the predetermined number of rows to create a square array. Top plates 710 of the cylinder capacitors 705 are coupled/connected to each together with a set of connectors 720. In some embodiments, the set of connectors 720 connect the top plates of the capacitors 705 by connecting the top plate portions of the top layers of the capacitors. In some embodiments, the top layer comprises a top layer as shown in FIGS. 5 and 6. In these embodiments, the top plate portions of the top layers can be easily connected to a connector through the side of the top layer.

Bottom plates 715 of the cylinder capacitors 705 can be coupled/connected together with connectors 725 to create combined capacitors of two or more cylinder capacitors 705. Since capacitance is proportional to the surface area of the plates, capacitance can be increased by increasing the area of the plates. As such, by connecting the bottom plates of two or more cylinder capacitors 705, capacitance can be increased. For example, if each of three cylinder capacitors have a capacitance of 1 fF, a capacitance of 3 fF can be created by connecting the bottom plates of the three cylinder capacitors. In some embodiments, the capacitor array is used in a capacitive DAC and comprises the capacitor bank of the capacitive DAC. In these embodiments, the top plate of all cylinder capacitors are connected to each other and the bottom plates of the cylinder capacitors are connected according to the DAC architecture. In some embodiments, the bottom plates are connected in a way to produce a binary weighted or segmented DAC. In some embodiments, the capacitor array is used in a capacitive DAC that is used in a SAR ADC.

For a binary weighted DAC, if the single unit capacitor (of FIGS. 3 and 6) is used for the LSB of the DAC, two units are connected to each other and used for the $2^{nd}$ LSB, four units are connected to each other and used for the $3^{rd}$ LSB, and so forth. Thus, for a binary weighted DAC having 10 bit resolution, the capacitors in the capacitor bank 105 and 205 from left to right would comprise 512 connected units (for the MSB), 256 connected units, 128 connected units, 64 connected units, 32 connected units, 16 connected units, 8 connected units, 4 connected units, 2 connected units, and 1 unit. Each set of connected units (e.g., 256 units) comprise a single capacitor in the bank 105 and 205 and is connected to the other processing circuits of the DAC according to the architecture of the DAC.

The size of the capacitor array is determined by the size of the single unit capacitor, which in turn is determined by how small the capacitor for the LSB can be while still maintaining accurate capacitance ratios between all capacitors. The size of the capacitor array is also determined by the resolution of the DAC which determines the number of unit capacitors needed in the array. For example, for a DAC with 10 bit resolution, 1023 total units are needed in the array which, for example, can be arranged as a 32×32 unit array providing 1024 units. In some embodiments, the unit capacitors are arranged in a two dimensional array having a predetermined number of columns and rows, the predetermined number of columns and rows being dependent on the resolution of the DAC. In some embodiments, the number of columns is equal to the predetermined number of rows to create a square array. In these embodiments, the number of columns and the number of rows is determined by the equation: $2^{\wedge}(N/2)$, where N equals the DAC resolution expressed in bits.

For a segmented DAC, the array of unit capacitors are connected according to a segmented architecture, which typically includes a digital decoder. The array of unit capacitors may be connected according to a segmented architecture using methods well known in the art which are not discussed in detail here.

While the invention has been described with reference to numerous specific details, one of ordinary skill in the art will recognize that the invention can be embodied in other specific forms without departing from the spirit of the invention. Thus, one of ordinary skill in the art would understand that the invention is not to be limited by the foregoing illustrative details, but rather is to be defined by the appended claims.

We claim:

1. A capacitor device array comprising:
   at least two capacitor devices, each capacitor device comprising:
   at least two lower layers, each lower layer comprising a bottom plate portion surrounding a top plate portion, the bottom and top plate portions being separated by a distance;

a top layer comprising a top plate portion between two separate bottom plate portions, the two separate bottom plate portions being unconnected across the top layer;

a first set of vias connecting the bottom plate portions of the layers; and a second set of vias connecting the top plate portions of the layers, wherein the top plate portions and the second set of vias comprise a top plate of the capacitor device; and a set of connectors connecting the top plates of the at least two capacitor devices by connecting the top plate portions of the top layers of the at least two capacitor devices.

2. The capacitor device array of claim 1, wherein the capacitor device array is used in a capacitive digital-to-analog converter (DAC).

3. The capacitor device array of claim 2, wherein:
the capacitive DAC has a resolution of a predetermined number of bits, from a least significant bit (LSB) to a most significant bit (MSB); and
the capacitor devices are arranged in a two dimensional array having a predetermined number of columns and rows, the predetermined number of columns and rows being dependent on the resolution of the capacitive DAC.

4. The capacitor device array of claim 3, wherein the architecture of the DAC is a segmented architecture.

5. The capacitor device array of claim 3, wherein:
the architecture of the DAC is a binary weighted architecture;
the at least two capacitor devices have approximately equal capacitance values;
a single capacitor device is coupled to the DAC for the LSB; and
two capacitor devices are coupled to each other and coupled to the DAC for the next LSB.

6. The capacitor device array of claim 1, wherein the capacitor device array is used in a capacitive DAC that is used in a successive approximation analog-to-digital converter (SAR ADC).

7. The capacitor device array of claim 1, wherein the bottom plate portion of each lower layer comprises a single unified structure.

8. A capacitive digital-to-analog converter (DAC) comprising:
a capacitor device array comprising at least two capacitor devices, each capacitor device comprising:
at least two lower layers, each lower layer comprising a bottom plate portion surrounding a top plate portion, the bottom and top plate portions being separated by a distance;

a top layer comprising a top plate portion between two separate bottom plate portions, the two separate bottom plate portions being unconnected across the top layer;

a first set of vias connecting the bottom plate portions of the layers; and a second set of vias connecting the top plate portions of the layers, wherein the top plate portions and the second set of vias comprise a top plate of the capacitor device; and a set of connectors connecting the top plates of the at least two capacitor devices by connecting the top plate portions of the top layers of the at least two capacitor devices; and one or more processing circuits coupled to the capacitor device array for converting a digital code into an analog signal using the capacitor device array.

9. The capacitive DAC of claim 8, wherein:
the capacitive DAC has a resolution of a predetermined number of bits, from a least significant bit (LSB) to a most significant bit (MSB); and
the capacitor devices are arranged in a two dimensional array having a predetermined number of columns and rows, the predetermined number of columns and rows being dependent on the resolution of the capacitive DAC.

10. The capacitive DAC of claim 9, wherein the architecture of the DAC is a segmented architecture.

11. The capacitive DAC of claim 9, wherein:
the architecture of the DAC is a binary weighted architecture;
the at least two capacitor devices have approximately equal capacitance values;
a single capacitor device is used for the LSB; and
two capacitor devices are coupled to each other and used for the next LSB.

12. The capacitive DAC of claim 8, wherein the capacitive DAC is used in a successive approximation analog-to-digital converter (SAR ADC).

13. The capacitive DAC of claim 8, wherein the at least three capacitor devices are arranged in a two dimensional array having at least one column and at least one row and the two dimensional array having at least one column and at least one row is an array having an equal number of columns and rows.

14. The capacitor device array of claim 8, wherein the bottom plate portion of each lower layer comprises a single unified structure.

* * * * *